(12) United States Patent
Belyansky et al.

(10) Patent No.: US 10,249,730 B1
(45) Date of Patent: Apr. 2, 2019

(54) CONTROLLING GATE PROFILE BY INTER-LAYER DIELECTRIC (ILD) NANOLAMINATES

(71) Applicant: International Business Machines Corporation, Armonk, NY (US)

(72) Inventors: Michael P. Belyansky, Halfmoon, NY (US); Andrew Greene, Albany, NY (US); Fee Li Lie, Albany, NY (US); Huimei Zhou, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/838,312

(22) Filed: Dec. 11, 2017

(51) Int. Cl.
| | |
|---|---|
| *H01L 21/8238* | (2006.01) |
| *H01L 29/66* | (2006.01) |
| *H01L 21/8234* | (2006.01) |
| *H01L 21/762* | (2006.01) |
| *H01L 29/06* | (2006.01) |
| *H01L 29/78* | (2006.01) |
| *H01L 29/161* | (2006.01) |

(52) U.S. Cl.
CPC .. *H01L 29/66545* (2013.01); *H01L 21/76229* (2013.01); *H01L 21/823425* (2013.01); *H01L 21/823431* (2013.01); *H01L 21/823468* (2013.01); *H01L 29/0665* (2013.01); *H01L 29/161* (2013.01); *H01L 29/6656* (2013.01); *H01L 29/66553* (2013.01); *H01L 29/66818* (2013.01); *H01L 29/7831* (2013.01)

(58) Field of Classification Search
CPC ....... H01L 21/823431; H01L 21/76229; H01L 21/823425; H01L 29/66545; H01L 29/0665; H01L 29/161
USPC .......................................................... 438/216
See application file for complete search history.

(56) References Cited

U.S. PATENT DOCUMENTS

| | | |
|---|---|---|
| 7,700,983 B2 | 4/2010 | Popp et al. |
| 8,921,178 B2 | 12/2014 | Manabe |
| (Continued) | | |

OTHER PUBLICATIONS

T. Yamashitaa et al., Opportunities and challenges of FinFET as a device structure candidate for 14nm node CMOS Technology, ECS Transactions, 34 (1) p. 81-86 (2011).

(Continued)

*Primary Examiner* — David S Blum
(74) *Attorney, Agent, or Firm* — Vazken Alexanian; Otterstedt, Ellenbogen & Kammer, LLP (57) ABSTRACT

A semiconductor structure includes a substrate, a plurality of parallel fins extending above the substrate, a plurality of gate structures perpendicular to the plurality of fins and including a plurality of sidewall spacers, and a plurality of source-drain regions intermediate the plurality of gate structures. A liner of a silicon-containing material is deposited over outer surfaces of the plurality of gate structures; over the liner, an inter-layer dielectric material is deposited. The semiconductor substrate with the deposited liner of silicon-containing material and deposited inter-layer dielectric material is annealed to at least partially consume the liner of silicon-containing material into the inter-layer dielectric material, to control residual stress such that resultant gate structures following the annealing have an aspect ratio range of 3:1 to 10:1, and are uniform in range to within seven percent of a target critical dimension.

15 Claims, 5 Drawing Sheets

(56) References Cited

U.S. PATENT DOCUMENTS

| | | |
|---|---|---|
| 9,105,661 B2 | 8/2015 | Huang et al. |
| 9,443,979 B2 | 9/2016 | Park et al. |
| 9,685,319 B2 | 6/2017 | Huang et al. |
| 2011/0012226 A1 | 1/2011 | Lee |
| 2014/0374838 A1 | 12/2014 | Chen et al. |
| 2015/0064929 A1 | 3/2015 | Tseng et al. |
| 2015/0333145 A1 | 11/2015 | Chudzik et al. |
| 2016/0027644 A1* | 1/2016 | Tsai .................. H01L 21/02576 257/408 |
| 2017/0229558 A1 | 8/2017 | Anderson et al. |

OTHER PUBLICATIONS

Chung-Hsun Lin, FinFET for 14nm Node and Beyond, 2013 CMOS Emerging Technologies Conference Presentation Slides vol. 6, Devices, Energy, and Sensors Track, Jul. 17-19, 2013 Whistler, BC, Canada, pp. 20-48.

A. M. Greene et al., "Fin Cut to Prevent Replacement Gate Collapse on STI," Unpublished U.S. Appl. No. 15/415,446, filed Jan. 25, 2017.

Wikipedia, Multigate Device, downlaoded Oct. 31, 2017 from https://en.wikipedia.org/wiki/Multigate_device, pp. 1-8.

Tom Dillinger, SemiWiki.com—Introduction to FinFET technology Part I, Published on Apr. 18, 2012, downloaded Oct. 31, 2017 from http://www.semiwiki.com/forum/content/1180-introduction-finfet-technology-part-i.html, pp. 1-4.

Tom Dillinger, SemiWiki.com—Introduction to FinFET technology Part II, Published on Apr. 27, 2012, downloaded Oct. 31, 2017 from http://www.semiwiki.com/forum/content/1228-introduction-finfet-technology-part-ii.html, pp. 1-4.

edaboard.com, "Why is polysilicon used instead of metal for gates in MOS?," Mar. 29, 2006-Dec. 24, 2010, downloaded Oct. 31, 2017 from http://www.edaboard.com/thread60563.html, pp. 1-5.

\* cited by examiner

| | POR | A-Si LINER |
|---|---|---|
| PC(B) | TARGET CD | TARGET CD |
| PC(C) | TARGET CD+3nm | TARGET CD+1nm |
| PC(T) | TARGET CD-4nm | TARGET CD-2nm |
| PC(H) | TARGET HEIGHT | TARGET HEIGHT |

CONTROLLING GATE PROFILE BY INTER-LAYER DIELECTRIC (ILD) NANOLAMINATES

BACKGROUND

The present invention relates to the electrical and electronic arts, and more specifically, to semiconductor fabrication techniques and the like.

Metal-oxide-semiconductor field-effect transistors (MOSFETs) have a source, a drain, and a metal oxide gate electrode. The metal gate is electrically insulated from the main semiconductor n-channel or p-channel by a thin layer of insulating material; for example, silicon dioxide or a high dielectric constant (high-k) dielectric. This makes the input resistance of the MOSFET relatively high. The gate-to-source voltage controls whether the transistor is ON or OFF.

N-type field effect transistors (NFETs) and p-type field effect transistors (PFETs) are two types of complementary MOSFETs. The NFET uses electrons as the current carriers and has n-doped source and drain regions. The PFET uses holes as the current carriers and has p-doped source and drain regions.

The FinFET is a type of MOSFET. The FinFET is a multiple-gate MOSFET device that mitigates the effects of short channels and reduces drain-induced barrier lowering. The "fin" refers to a semiconductor material patterned on a substrate that often has three exposed surfaces that form the narrow channel between the source and drain regions. A thin dielectric layer arranged over the fin separates the fin channel from the gate. Since the fin provides a three-dimensional surface for the channel region, a larger channel length may be achieved in a given region of the substrate as opposed to a planar FET device.

FinFETs can be fabricated with either a 'gate-first' or a 'gate-last' process. In a gate-last sequence, a dummy polysilicon gate is initially patterned and used for source and drain formation; then the dummy gate is removed and the replacement metal gate composition is patterned.

Figure 1:
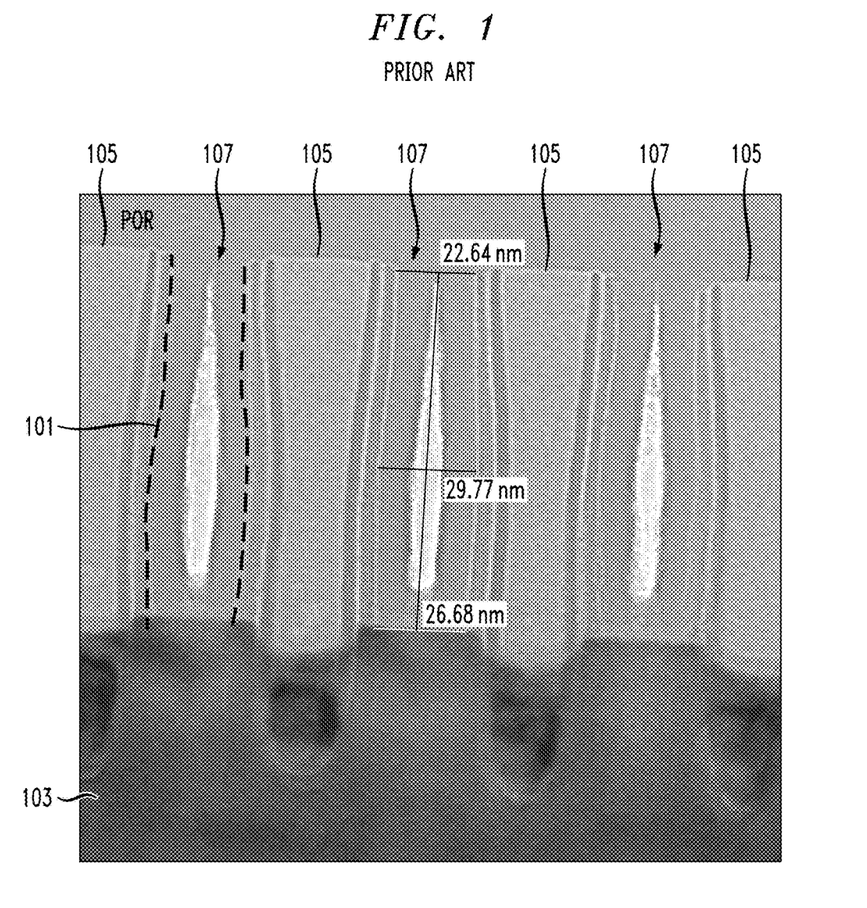
FIG. 1 depicts an exemplary prior-art spacer profile (Transmission electron microscopy (TEM) image)

Referring to the Transmission electron microscopy (TEM) image in FIG. 1, in current FinFET fabrication, a bowl-shaped profile for the gate trench is observed, impacting the device performance and/or yield. In particular, different spacer thickness (THK) along the bowl shape impacts the gate (e.g. polysilicon conductor (PC)) profile and/or the effective capacitance, $C_{eff}$, of the circuit). The issues with the bowl-shaped profiles may arise in both dummy gate/gate last and gate first fabrication techniques. This bowl shape is a consequence of, e.g., Flowable Chemical Vapor Deposition (FCVD) plus anneal, which results in pulling of Polycrystalline silicon (Poly) at two sides. The "pulling" is the result of tensile stress induced by the vapor deposition and annealing. In FIG. 1 (which depicts a prior art or point-of-reference (POR) example), element 103 is the substrate with fins; and elements 105 represent $SiO_2$ dielectric defining trenches 107 into which the actual gates will subsequently be deposited. The dotted lines 101 show the bowl-shaped profile of the trenches. The demo gate length achieves target PC CD (critical dimension) at the fin surface, target PC CD+3 nm at the widest point, and target PC CD-4 nm at the top. The thinness of the gate at the upper part of the bowl shape can potentially cause gate metal gap filling problems, and the top part of the bowl shape could cause leakage problems from spacer reactive ion etching (RIE). The bowl-shaped variations in the trench width are undesirable. Exemplary dimensions herein are not to be taken as limiting unless recited in the claims.

BRIEF SUMMARY

Embodiments of the present disclosure provide techniques for controlling dummy gate profile by inter-layer dielectric (ILD) nanolaminates. According to an embodiment of the present invention, an exemplary method includes providing a semiconductor structure including a substrate, a plurality of parallel fins extending above the substrate, a plurality of gate structures perpendicular to the plurality of fins and including a plurality of sidewall spacers, and a plurality of source-drain regions intermediate the plurality of gate structures. The method further includes depositing over outer surfaces of the plurality of gate structures a liner of a silicon-containing material; depositing over the liner of silicon-containing material an inter-layer dielectric material; and annealing the semiconductor substrate with the deposited liner of silicon-containing material and deposited inter-layer dielectric material, to at least partially consume the liner of silicon-containing material into the inter-layer dielectric material, to control residual stress such that resultant gate structures following the annealing have an aspect ratio range of 3:1 to 10:1, and are uniform in range to within seven percent of a target critical dimension.

A product formed by the process just described is also contemplated.

According to another embodiment of the present invention, an exemplary semiconductor structure includes a substrate; a plurality of parallel fins extending above the substrate; a plurality of gate structures perpendicular to the plurality of fins and including a plurality of sidewall spacers; a plurality of source-drain regions intermediate the plurality of gate structures; and an inter-layer dielectric material over the source-drain regions and the gate structures. The gate structures have an aspect ratio range of 3:1 to 10:1, and are uniform in range to within seven percent of a target critical dimension.

Techniques of the present invention can provide substantial beneficial technical effects. For example, one or more embodiments provide a more uniform gate trench profile as compared to prior art techniques.

These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of several illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

FIGS. 5A-5D schematically illustrate several exemplary sequences of fabrication steps that may be employed in controlling gate profiles by inter-layer dielectric (ILD) nano-laminates. Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. While some individual processing steps are set forth herein, those steps are merely illustrative, and one skilled in the art may be familiar with several equally suitable alternatives that would be applicable.

As noted, the bowl-shaped trench profile in current techniques is undesirable. One or more embodiments advantageously utilize an additional in-situ steam generation (ISSG) amorphous Silicon (a-Si) layer deposit before FCVD $SiO_2$ deposition, and then anneal. The resultant gate profile is more uniform than the current POR, as will be apparent from a comparison of FIG. 2 (discussed further below) to FIG. 1. One or more embodiments advantageously provide techniques to change the a-Si thickness (THK) for profile tuning. Furthermore, one or more embodiments change the anneal temperature to consume more Si and thus obtain a more uniform dummy gate by compensating for the tensile stress from the FCVD $SiO_2$ deposition.

Figure 4A:
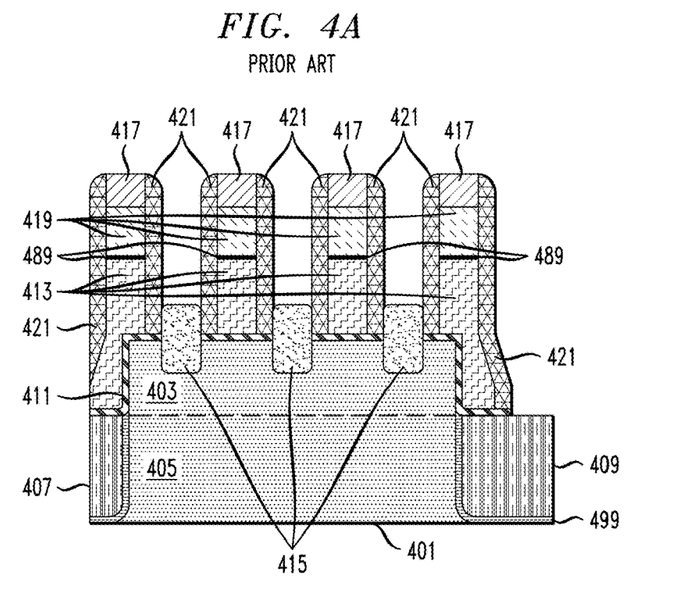
FIGS. 4A and 4B show prior-art fabrication steps corresponding to the exemplary spacer profile of FIG. 1—in particular, a starting structure (FIG. 4A) and a resultant structure after FCVD and annealing (FIG. 4B)

Referring now to FIG. 4A, element 401 represents a Silicon (Si) substrate (region 405 below the dotted line) with fins (region 403 above the dotted line). Regions 407, 409 are shallow trench isolation (STI) regions; e.g., Silicon dioxide ($SiO_2$). The dotted line coincides with the top of the regions 407, 409. There is also a thin layer of $SiO_2$ 411 covering the fin surface and outer surfaces of the regions 407, 409. Regions 413 comprise dummy gate PC (polysilicon (Poly-crystalline silicon or "Poly") or a-Si). On top of the dummy gates 413 there is an optional thin oxide liner 489, followed by optional Silicon Nitride (SiN) caps 419 and optional oxide layer 417 (e.g. $SiO_2$) above the caps. Regions 415 comprise epitaxially grown doped source-drain regions. Elements 421 comprise sidewall spacers formed from, e.g., Silicon-Boron-Carbon-Nitride (SiBCN). Embodiments are applicable to gate-first and gate-last (dummy gate) techniques. When the dummy gate approach is employed, the sidewall spacers become the liners for the trenches into which the actual metal gates are later deposited. The structure of FIG. 4A thus comprises a well-known intermediate structure in FinFET fabrication, including a substrate with a plurality of fins and a plurality of gate structures (413 with optional caps 419 and optional oxide fill 417) with sidewall spacers 421. "Dummy" gate structures are shown in the non-limiting example in the figures. Exemplary materials have been set forth but embodiments are equally applicable to similar intermediate structures using other types of materials. Aspects of the invention can be used with both SOI and bulk substrates.

Element 499 as shown in FIGS. 4A-5D is an optional STI liner as known to the skilled artisan.

Figure 4B:
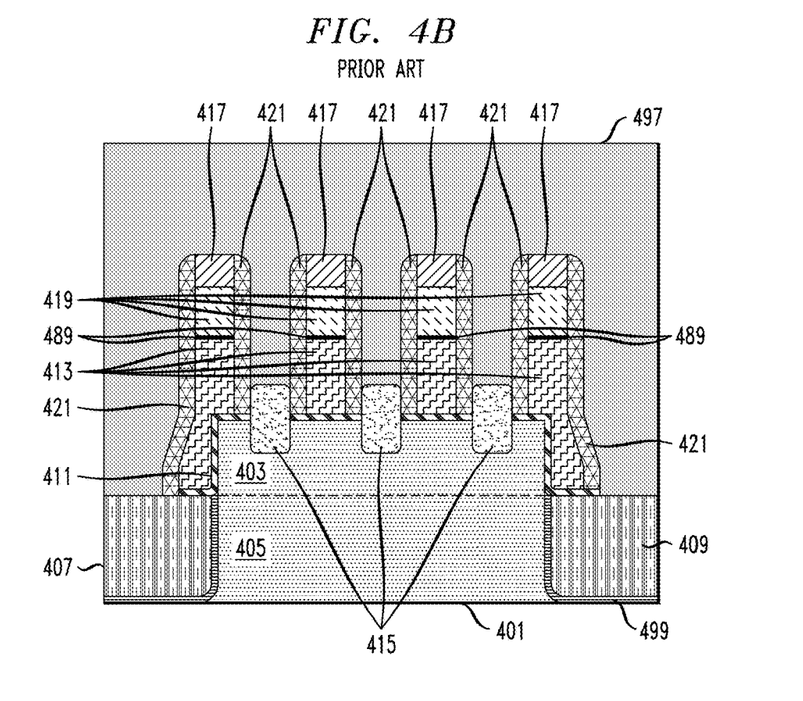

FIG. 4B shows the structure of FIG. 4A after FCVD of ILD (e.g. $SiO_2$) 497 and annealing. In a non-limiting example, the ILD 497, 597 (discussed below) is a flowable oxide, although this is non-limiting as there are many other suitable materials.

Figure 5A:
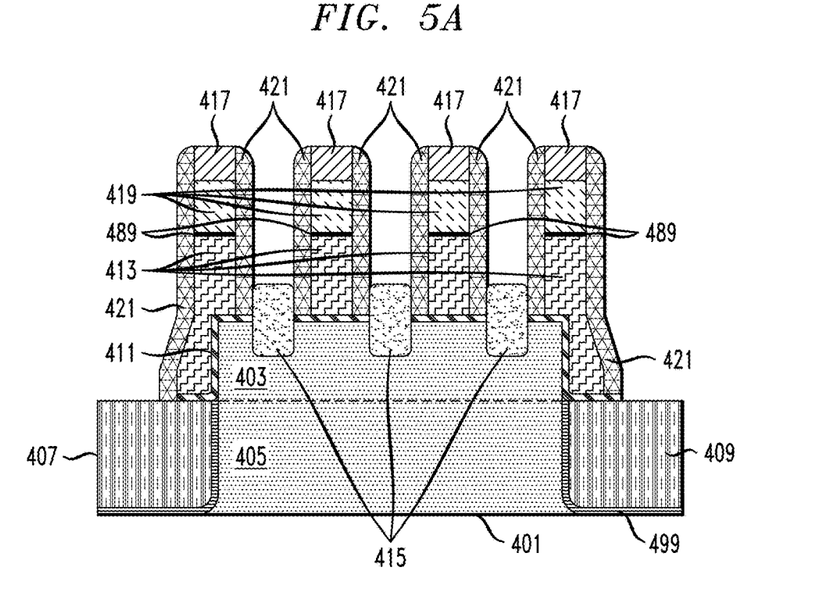
FIGS. 5A-5D show fabrication steps in accordance with aspects of the invention, corresponding to the exemplary spacer profile of FIG. 2—in particular, a starting structure (FIG. 5A), deposition of amorphous silicon liner (FIG. 5B), resultant structure after FCVD (FIG. 5C), and resultant structure after annealing (FIG. 5D).
Figure 5B:
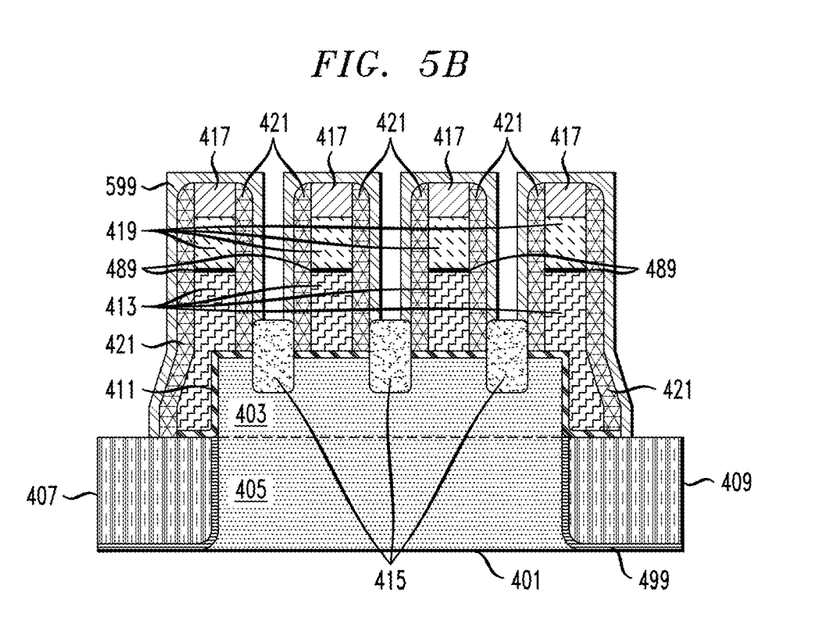
Figure 5C:
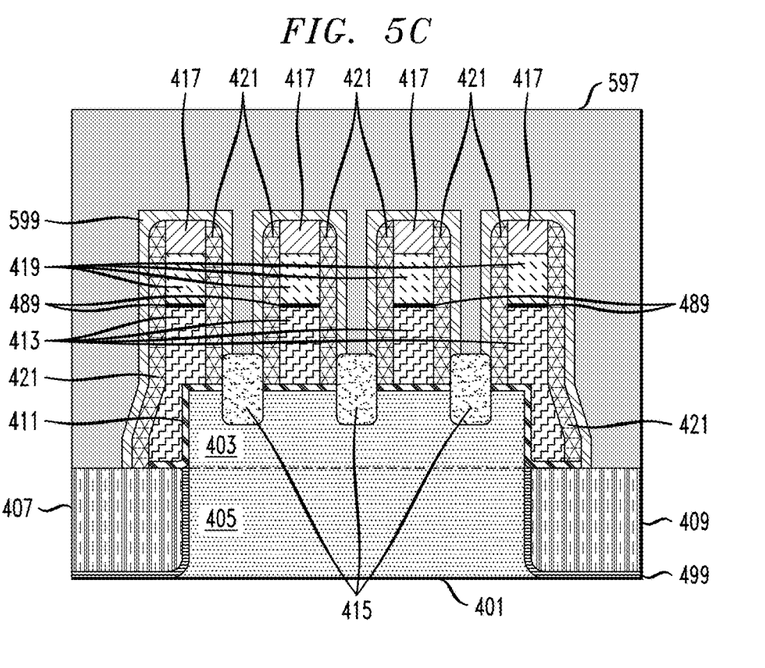
Figure 5D:
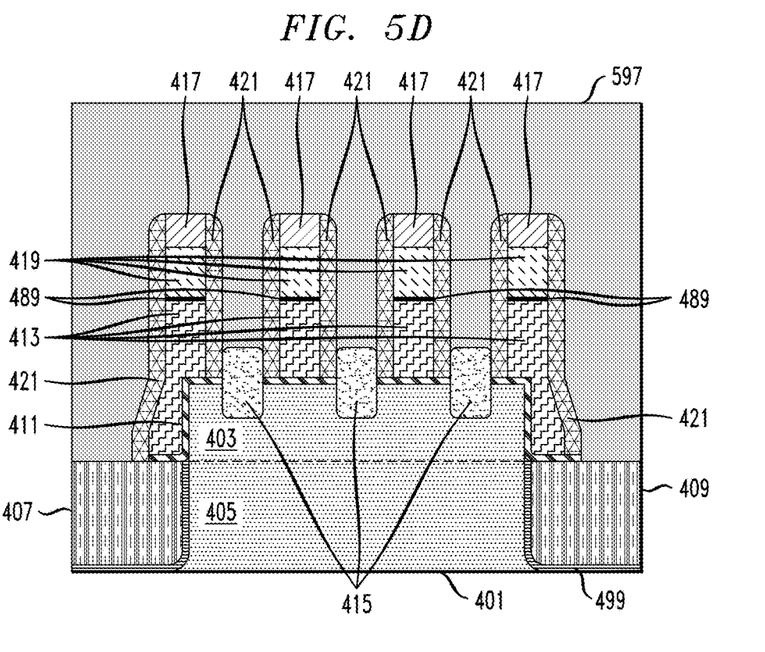

Referring now to FIGS. 5A-5D, FIG. 5A is an exemplary starting point for a technique in accordance with an aspect of the invention, and is identical to FIG. 4A. FIG. 5A is not designated as "prior art" herein because it represents a stage in the inventive process of FIGS. 5A-5D. In FIG. 5B, a liner layer 599 of a-Si is deposited over the structure of FIG. 5A. In FIG. 5C, an inter-layer dielectric (ILD) 597 such as $SiO_2$ is deposited via FCVD. Finally in FIG. 5D a wet annealing process is carried out. Thus, in one or more embodiments, an additional in situ steam generation (ISSG) a-Si layer 599 is deposited (FIG. 5B) before FCVD $SiO_2$ deposition (FIG. 5C) and then wet annealing is carried out (FIG. 5D). The thickness of the a-Si layer 599 can be changed for profile tuning. The anneal temperature can be changed to consume more a-Si. The presence of oxygen in water during the wet annealing process causes the a-Si layer 599 to become $SiO_2$ (i.e. part of ILD 597). The skilled artisan can complete the fabrication process based on the resultant structure of FIG. 5D using known techniques.

The oxidation (conversion) of the a-Si liner to $SiO_2$ (ILD) is typically completed in full, depending on the oxidation temperature and duration (typically 400 C-1000 C, few hours long) and anneal ambient (oxygen or water/steam). Steam anneal is more effective in converting silicon to silicon dioxide than dry oxygen. The annealing temperature can be tuned depending on the a-Si liner thickness (or other liner material, such as SiN) to completely consume the Si liner (or in the case of silicon nitride (SiN) liner converted to silicon oxynitride (SiON) liner) for example. In the a-Si case it becomes $SiO_2$ like the rest of the ILD with no boundary seen on TEM. In other cases, a liner interface can still be seen, meaning it was not completely converted to $SiO_2$ (or that it has a different composition; e.g., like SiON for example). The greater the thickness of the a-Si liner (>3 nm), the longer time or higher temperature needed to oxidize the a-Si liner.

The higher the liner thickness, the more positive effect on profile or device performance it can exert. However, semiconductor scaling limits the available real estate (space), so a typical liner thickness for advanced technologies is limited to about less than 5 nm, since some room is needed for ILD deposition. A-Si deposition can be done by rapid thermal deposition or by other CVD (chemical vapor deposition) or ALD (Atomic Layer Deposition) techniques; the same is true for a SiN liner. ALD or CVD (or plasma enhanced PECVD or PEALD techniques) are typically used to control a thin liner thickness.

The higher the oxidation temperature, the more silicon can be converted to SiO$_2$ during the oxidative anneal, and at temperatures above 1000 C, 10-100 nm of Si can be consumed in water/steam ambient. Other materials that can be used as a liner are: SiN, SiON, silicon carbide (SiC), silicon-germanium (SiGe), or other silicon containing materials. Since the as-deposited liner materials have different stress levels and different oxidation behaviors, they will produce different gate profile changes and affect a transistor device in a different way. Partial oxidation at insulator liner material can be used to preserve the bottom part of a liner material from oxidation, thus fine tuning the beneficial profile of the gate by selecting the appropriate liner thickness and oxidation temperature, ambient, and duration to leave some part of the liner unoxidized.

Thus, in one or more non-limiting exemplary embodiments, substrate 401 can be silicon-on-insulator (SOI) or bulk Silicon; elements 407 and 409 are shallow trench isolation (STI) regions (e.g., Silicon dioxide (SiO$_2$)); element 411 is a thin layer of SiO$_2$; element 413 is gate poly; element 489 is a protective oxide liner (optional); and elements 419 are Silicon Nitride (SiN) caps (optional). Furthermore, element 417 is oxide fill (e.g. SiO$_2$); elements 415 are epitaxially grown source-drain regions; elements 421 are sidewall spacers on gates which subsequently form liners of the trenches into which the actual gates are deposited (e.g., SiBCN); and elements 497, 597 are ILD.

Figure 2:
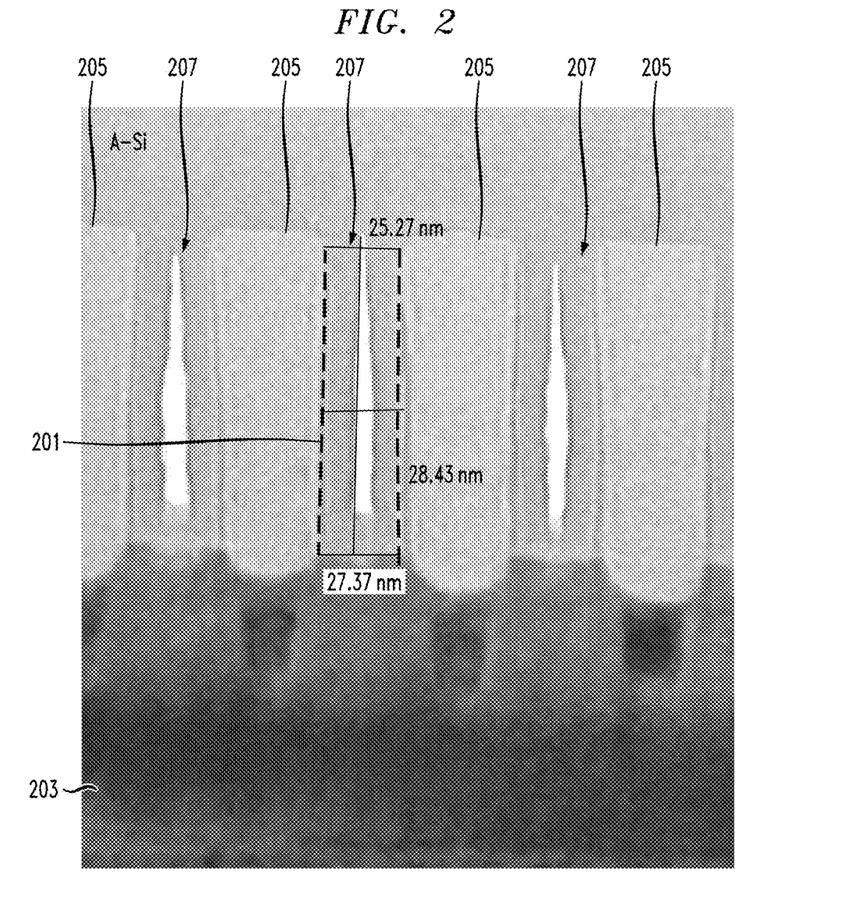
FIG. 2 depicts an exemplary spacer profile (TEM image) achieved in accordance with aspects of the invention.

Referring to the TEM image in FIG. 2, in comparison to the current FinFET issues with the dummy gate bowl-shaped profile as in FIG. 1, in one or more exemplary embodiments employing aspects of the invention, a more uniform profile is observed. In FIG. 2, element 203 is the substrate with fins; and elements 205 represent SiO$_2$ dielectric defining trenches 207 into which the actual gates will subsequently be deposited. The dotted lines 201 show the improved profile of the trenches. The gate length achieves target PC CD at the bottom, target PC CD+1 nm at the widest point, and target PC CD-2 nm at the top. The improved uniformity (delta of PC CD is 3 nm compare with POR of 7 nm) of the spacer reduces the chance for leakage or other deleterious effects as compared to the prior art.

Figure 3:
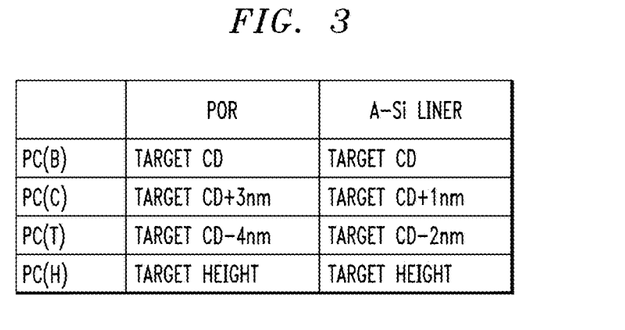
FIG. 3 presents a table of exemplary spacer profile dimensions obtained according to an aspect of the invention, and compared with techniques not using aspects of the invention.

The table of FIG. 3 compares the dimensions (in nm) for the point-of-reference approach of FIG. 1 (middle column) with those for the exemplary embodiment of FIG. 2 (right-hand column).

With continued reference to FIGS. 1-3, it will be appreciated that the trenches 207 achieved with an exemplary embodiment of the invention are more uniform than those 107 achieved with current techniques. Note that in making the TEM images of FIGS. 1 and 2, the dummy gates 413 are pulled and the voids filled with another layer of a-Si to make a good quality TEM image.

It will be appreciated that materials other than those described herein can be employed in controlling gate profiles by inter-layer dielectric (ILD) nanolaminates. Other materials that can be used as liner are: SiN, SiON, SiC, SiOC, SiGe, or other silicon containing materials.

Fabricating complete integrated circuit chips using techniques disclosed herein may require removal of material; there are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material when forming a semiconductor structure. The techniques and application of etching are well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., Silicon VLSI Technology: Fundamentals, Practice, and Modeling 1st Edition, Prentice Hall, 2001 and P. H. Holloway et al., Handbook of Compound Semiconductors: Growth, Processing, Characterization, and Devices, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more layers of a type commonly used in such integrated circuit devices may not be explicitly shown in a given figure for ease of explanation. This does not imply that the layer(s) not explicitly shown are omitted in the actual integrated circuit device.

Given the discussion thus far, it will be appreciated that, in general terms, an exemplary method, according to an aspect of the invention, includes providing a semiconductor structure (e.g., FIG. 5A) including a substrate 405, a plurality of parallel fins 403 extending above the substrate, a plurality of gate structures 413, 417, 419 perpendicular to the plurality of fins and including a plurality of sidewall spacers 421, and a plurality of source-drain regions 415 intermediate the plurality of gate structures. A further step (e.g., FIG. 5B) includes depositing over outer surfaces of the plurality of gate structures a liner 599 of a silicon-containing material (e.g., a-Si, SiN, SiON, SiC, SiOC, SiGe, or other silicon containing materials). A still further step (e.g., FIG. 5C) includes depositing over the liner of silicon-containing material an inter-layer dielectric material 597. Suitable materials and techniques include, for example, FCVD and spin-on techniques—suitable materials include, for example, ILD oxide-like materials, including so called low-k materials (with dielectric constant <4) which can be obtained by spin-on technique as well as CVD, including but not limited to SiO2, SiOC, SiOCH, SiOCN, SiBCN and other dielectric materials.

Yet a further step (e.g., FIG. 5D) includes annealing the semiconductor substrate with the deposited liner of silicon-containing material and deposited inter-layer dielectric material, to at least partially consume the liner of silicon-containing material into the inter-layer dielectric material, to control residual stress such that resultant gate structures following the annealing have an aspect ratio range of 3:1 to 10:1, and are uniform in range to within seven percent of a target critical dimension (e.g., width along "bowl" shape varies at no point by more than seven percent from target or realized average; in a non-limiting example, 2 nm/27 nm). The target critical dimension could be, for example, the PC target CD. The CD could be the trench width at the base, for example. In some cases, the trench depth is at least 100 nm but other embodiments need not be that deep. The aspect ratio is depth:width. The target critical dimension is that dimension which is desired; in an alternative approach, an average critical dimension obtained in a final product could be used (e.g., measure actual width in several places, take average; TEM images show three width measurements, for example).

The tuning is done by adjusting temperature and time of the oxidative anneal and by varying liner thickness. The oxidative anneal temperature varies from, e.g., 400-800 C and the anneal duration could vary, for example, from minutes to several hours. In one or more embodiments, several anneals are employed, with the longest one being at least one hour and 500 C. Annealing is carried out to reduce residual stress such that the trench profile varies by no more than a certain percentage. Depending on the type of ILD, in some circumstances it might be desirable to increase the stress and/or volume of the liner. Note that a-Si when oxidized doubles in volume. What is pertinent in one or more embodiments is to compensate the total stress on the gate structure to obtain substantially uniform gate structures/trenches. Some embodiments control such that the sidewalls have no more than 2 degrees variation from vertical (90 degrees); i.e., the tangent to the sidewall at any point does not vary by more than plus or minus 2 degrees from the vertical.

In some instances, the liner of silicon-containing material is completely consumed into the inter-layer dielectric material during the annealing.

In some embodiments, in the step of depositing the liner of silicon-containing material, the liner has a thickness of from 1-5 nm, or even 2-3 nm.

In some embodiments, in the step of depositing the liner of silicon-containing material, the liner comprises amorphous silicon.

The annealing can be carried out, for example, at a temperature of from 400-800 C; in some instances, the annealing is carried out for at least one hour at a temperature of at least 500 C.

In some embodiments, in the providing step, the gate structures comprise dummy gate structures (however, other embodiments can be used with gate-first technologies).

In one or more embodiments, in the annealing step, the resultant gate structures following the annealing have sidewalls not varying by more than two degrees from vertical.

Other materials besides a-Si that can be used for the liner of silicon-containing material include SiN, SiON, SiC, SiOC, SiGe, or the like.

One or more products produced by the process(es) just described are also contemplated.

In another aspect, referring, e.g., to FIG. 5D, an exemplary semiconductor structure includes a substrate 405, a plurality of parallel fins 403 extending above the substrate, a plurality of gate structures 413, 417, 419 perpendicular to the plurality of fins and including a plurality of sidewall spacers 421, and a plurality of source-drain regions 415 intermediate the plurality of gate structures. Also included is an inter-layer dielectric material 597 over the source-drain regions and the gate structures. The gate structures have an aspect ratio range of 3:1 to 10:1, and are uniform to within seven percent of a target critical dimension as discussed above.

In one or more embodiments, the gate structures comprise dummy gate structures (however, as noted, gate first processes are also contemplated; furthermore, in both gate-first and gate-last approaches, the actual gates can have the dimensions, aspect ratios, uniformity, etc. as described herein).

In some instances, the gate structures have sidewalls not varying by more than two degrees from vertical.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits. Any of the exemplary devices illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having transistors therein formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this invention is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" or adjoining another layer, it will be understood that there may or may not be intermediate elements or layers between the two specified layers. If a layer is described as "directly on" another layer, direct contact of the two layers is indicated.

The corresponding structures, materials, acts, and equivalents of means or step-plus-function elements, if any, in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical invention. It is submitted with the understanding that it will not be used to interpret or limit the scope or meaning of the claims. In addition, in the foregoing Detailed Description, it can be seen that various features are grouped together in a single embodiment for the purpose of streamlining the invention. This method of invention is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method comprising:
   providing a semiconductor structure including a substrate, a plurality of parallel fins extending above the substrate, a plurality of gate structures perpendicular to the plurality of fins and including a plurality of sidewall spacers, and a plurality of source-drain regions intermediate the plurality of gate structures;
   depositing over outer surfaces of said plurality of gate structures a liner of a silicon-containing material;
   depositing over said liner of silicon-containing material an inter-layer dielectric material; and
   annealing said semiconductor substrate with said deposited liner of silicon-containing material and deposited inter-layer dielectric material, to at least partially consume said liner of silicon-containing material into said inter-layer dielectric material, to control residual stress such that resultant gate structures following said annealing have an aspect ratio range of 3:1 to 10:1, and are uniform in range to within seven percent of a target critical dimension.

2. The method of claim 1, wherein said liner of silicon-containing material is completely consumed into said inter-layer dielectric material during said annealing.

3. The method of claim 2, wherein in said step of depositing said liner of silicon-containing material, said liner has a thickness of from 1-5 nm.

4. The method of claim 3, wherein in said step of depositing said liner of silicon-containing material, said liner comprises amorphous silicon.

5. The method of claim 4, wherein in said step of depositing said liner of silicon-containing material, said liner has a thickness of from 2-3 nm.

6. The method of claim 4, wherein said annealing is carried out at a temperature of from 400-800 C.

7. The method of claim 4, wherein said annealing is carried out for at least one hour at a temperature of from 500-800 C.

8. The method of claim 6, wherein, in said providing step, said gate structures comprise dummy gate structures.

9. The method of claim 6, wherein, in said annealing step, said resultant gate structures following said annealing have sidewalls not varying by more than two degrees from vertical.

10. The method of claim 3, wherein in said step of depositing said liner of silicon-containing material, said liner comprises SiN.

11. The method of claim 3, wherein in said step of depositing said liner of silicon-containing material, said liner comprises SiON.

12. The method of claim 3, wherein in said step of depositing said liner of silicon-containing material, said liner comprises SiC.

13. The method of claim 3, wherein in said step of depositing said liner of silicon-containing material, said liner comprises SiOC.

14. The method of claim 3, wherein in said step of depositing said liner of silicon-containing material, said liner comprises SiGe.

15. The method of claim 1, wherein said resultant gate structures following said annealing step have a depth of at least 100 nm.

* * * * *